US010335922B2

(12) United States Patent
Phatak et al.

(10) Patent No.: US 10,335,922 B2
(45) Date of Patent: Jul. 2, 2019

(54) NON-CONDUCTIVE SUBSTRATE WITH TRACKS FORMED BY SAND BLASTING

(71) Applicant: DIRECTOR GENERAL, CENTRE FOR MATERIALS FOR ELECTRONICS TECHNOLOGY, Pune, Maharashtra (IN)

(72) Inventors: Girish Phatak, Maharashtra (IN); Shrikant Kulkarni, Maharashtra (IN); Vijaya Giramkar, Maharashtra (IN); Shany Joseph, Maharashtra (IN)

(73) Assignee: DIRECTOR GENERAL, CENTRE FOR MATERIALS FOR ELECTRONICS TECHNOLOGY, Pune, Maharashtra (IN)

( * ) Notice: Subject to any disclaimer, the term of this patent is extended or adjusted under 35 U.S.C. 154(b) by 34 days.

(21) Appl. No.: 15/542,567

(22) PCT Filed: Jan. 8, 2016

(86) PCT No.: PCT/IB2016/050083
§ 371 (c)(1),
(2) Date: Jul. 10, 2017

(87) PCT Pub. No.: WO2016/113651
PCT Pub. Date: Jul. 21, 2016

(65) Prior Publication Data
US 2018/0264623 A1    Sep. 20, 2018

(30) Foreign Application Priority Data

Jan. 13, 2015   (IN) .......................... 130/MUM/2015

(51) Int. Cl.
*B24C 1/04*        (2006.01)
*B24C 11/00*       (2006.01)
(Continued)

(52) U.S. Cl.
CPC ................ *B24C 3/322* (2013.01); *B24C 1/04* (2013.01); *B24C 11/00* (2013.01); *H05K 3/027* (2013.01);
(Continued)

(58) Field of Classification Search
CPC .......... B24C 1/04; B24C 3/322; B24C 11/00; H05K 3/027; H05K 3/04; H05K 3/045; H05K 2203/025; H05K 2203/1126
(Continued)

(56) References Cited

U.S. PATENT DOCUMENTS 3,240,624 A * 3/1966  Beck ....................... C03C 17/00
                                                           264/104
4,232,059 A * 11/1980 Proffitt ...................... B24C 1/04
                                                             216/17
(Continued)

FOREIGN PATENT DOCUMENTS

WO   WO 2009088363 A1 * 7/2009 ............... B24C 1/00

OTHER PUBLICATIONS

International Search Report of PCT/IB2016/050083, dated Jul. 11, 2016.

*Primary Examiner* — Eileen P Morgan
(74) *Attorney, Agent, or Firm* — Collard & Roe, P.C.

(57) ABSTRACT

A method for forming track(s) on low temperature co-fired ceramic (LTCC) substrate, the method comprising the steps of, forming a layer of coating material on an operative face of the LTCC substrate, disposing a stencil on the layer of coating material thereby covering a selected portion of the layer of coating material while leaving exposed a portion of the layer of coating material corresponding to the track(s) to be formed and forming an assembly of the LTCC substrate, the layer of coating material and the stencil, eroding the exposed portion of the layer of coating material by propel-
(Continued)

ling an abrasive material using a blasting gun towards the assembly on the face on which the layer of coating material is formed and the stencil is disposed and separating the stencil from the abraded assembly, wherein the abrasive material has a composition that is compatible with that of the LTCC substrate.

10 Claims, 6 Drawing Sheets

(51) Int. Cl.
  *B24C 3/32* (2006.01)
  *H05K 3/02* (2006.01)
(52) U.S. Cl.
  CPC .................. *H05K 2203/025* (2013.01); *H05K 2203/1126* (2013.01)
(58) Field of Classification Search
  USPC ...................................................... 451/29, 75
  See application file for complete search history.

(56) References Cited

U.S. PATENT DOCUMENTS

| | | | | |
|---|---|---|---|---|
| 4,447,519 | A * | 5/1984 | Pritikin | G03F 7/16 216/17 |
| 5,069,004 | A * | 12/1991 | Gillenwater | B24C 1/04 118/504 |
| 5,989,689 | A * | 11/1999 | Komatsu | B24C 1/04 428/201 |
| 6,047,637 | A * | 4/2000 | Chan | B41M 1/12 101/128.21 |
| 2003/0104321 | A1* | 6/2003 | Kim | B24C 1/04 430/321 |
| 2005/0012217 | A1* | 1/2005 | Mori | H01L 23/49822 257/758 |
| 2005/0048416 | A1* | 3/2005 | Osawa | B24C 1/04 430/322 |
| 2007/0209178 | A1* | 9/2007 | Savic | H01G 4/12 29/25.41 |
| 2007/0259606 | A1* | 11/2007 | Williams | B24C 1/04 451/31 |
| 2010/0252304 | A1* | 10/2010 | Muramatsu | H01L 21/563 174/251 |

* cited by examiner

NON-CONDUCTIVE SUBSTRATE WITH TRACKS FORMED BY SAND BLASTING

CROSS REFERENCE TO RELATED APPLICATIONS

This application is the National Stage of PCT/IB2016/050083 filed on Jan. 8, 2016, which claims priority under 35 U.S.C. § 119 of Indian Application No. 130/MUM/2015 filed on Jan. 13, 2015, the disclosure of which is incorporated by reference. The international application under PCT article 21(2) was published in English.

FIELD OF THE DISCLOSURE

The present disclosure generally relates to a non-conductive substrate with tracks formed and a method for forming the tracks and more particularly to a non-conductive substrate with tracks formed and a method for forming the tracks the tracks by sand blasting. The tracks formed can be conductive, semi-conductive, non-conductive or combinations thereof.

Definitions

Conductive track: herein means a conductive or electrical track or connector formed by using the presently disclosed method by using an electrically conducting material.

Semi-conductive track: herein means a semi-conductive track or connector formed by using the presently disclosed method by use of a semi-conducting material such as silicon.

Non-conductive track: herein means a non-conductive track or connector formed by using the presently disclosed method by use of a non-conducting material such as non conducting polymers, glass-reinforced epoxy laminate sheet (FR4 sheets)/Glass Epoxy Fiberglass Sheets, and quartz or glass.

FRP: fiber-reinforced plastic (FRP) is a composite material made of a polymer matrix reinforced with fibers. The fibers may include glass, carbon, basalt or around, but are not limited to these.

Green Tape: as used herein refers to an LTCC material system from DuPont Microcircuit Materials (MCM) that provides the combined benefits of low sintering temperature co-fired glass-ceramic tape as a substrate for thick film.

Shrinkage: as used herein means change in the package dimensions (length, width and height) in percentage (%) after sintering process compared to green state package dimensions. The after firing dimensions are usually less than before firing dimension due to the agglomeration of crystalline materials and due to recrystallization of glass and evaporation of the organic part during the sintering process.

Non-conducting substrate: herein means a base or mandrel that is electrically non-conducting or is made of electrically non-conducting material.

Stencil: herein means a mask or a sheet with a pattern cut out of it, such that when the stencil is placed on the layer of coating material that is applied on the non-conducting substrate and sand blasted, the unwanted portion of the layer of coating material is 'eroded' or 'removed' due to sand blasting whereas that portion of the layer of coating material remains intact on the substrate which corresponds to the desired track.

Abrasive material: herein means the particles used to abrade or erode or remove the layer of coating material formed or disposed on the non-conductive substrate. The abrasive material is also referred to as sand or abrading material or particles.

BACKGROUND

Low temperature co-fired ceramic (LTCC) devices are monolithic microelectronic devices. In these devices, the entire ceramic support structure and any conductive, resistive, and dielectric materials are fired in a kiln simultaneously. Typical LTCC devices include capacitors, inductors, resistors, transformers, and hybrid circuits.

LTCC technology is also used for a multilayer packaging for the electronics industry, MEMS, microprocessor and RF applications.

LTCC technology as compared to other packaging technologies exhibits the advantage that the LTCC can be generally fired at temperatures below 1000° C. This can be attributed to the special composition of the LTCC material. Due to this low temperature, it is possible to co-fire the LTCC with at least one material selected from a group consisting of conductive, semi-conductive, non-conductive materials, and combination thereof.

In particular, LTCC may be used to fabricate microwave devices, such as microwave antennas that are compact and lightweight.

Typically, the microwave devices are fabricated using the LTCC technology by printing conductive, semi-conductive, and non-conductive tracks (hereinafter referred to as 'track' or 'tracks') by using thick film screen printing method. Typical dimensions of the devices (such as antennas) may range from about 50 microns to about 200 microns with a typical thickness in the range from about 10 microns to 30 microns.

In order to achieve desired attenuation losses of the microwave devices (or circuit) it is necessary that the tracks formed have accurate dimension.

It is observed that using the conventional screen printing technology for forming the tracks, the dimensional accuracy of the devices and/or the circuits is difficult to achieve.

Further, it is observed that the method of forming tracks, using the conventional screen printing technique, inevitably necessitates control of one or more of the following factors including:
  environmental conditions;
  paste properties;
  operator skills; and
  paste and substrate interactions.

These factors affect the reproducibility of the tracks and hence the device being fabricated.

Thus, there is a need for providing a method of forming tracks on the LTCC substrate that obviates one or more disadvantages of the conventional screen printing technique. There is a need for providing a method that forms tracks that are reproducible. Further, there is a need for providing a method that facilitates in achieving the desired dimensional accuracy of the tracks being formed. Still further, there is a need for a method that does not necessitates control of one or more of the following factors including environmental conditions, paste properties, operator skills and paste and substrate interactions.

Objects

Some of the objects of the present disclosure, which at least one embodiment herein satisfies are as follows:

It is an object of the present disclosure to ameliorate one or more problems of the prior art or to at least provide a useful alternative.

An object of the present disclosure is to provide a method for forming tracks on non-conductive substrates;

Another object of the present invention is to provide a method for forming tracks on LTCC substrate;

Still another object of the present disclosure is to provide a method for forming tracks on LTCC substrates with improved dimensional accuracy;

Yet another object of the present disclosure is to provide a method for forming tracks on LTCC substrates that is not affected by ambient environmental conditions;

Another object of the present disclosure is to provide a method for forming tracks on LTCC substrates that is independent of human operator skills;

Still another object of the present disclosure is to provide a method for forming tracks on LTCC substrates that is not limited by the paste properties applied on it.

Yet another object of the present disclosure is to provide a non-conductive substrate with tracks formed thereon.

Other objects and advantages of the method of the present disclosure will be more apparent from the following description, which are not intended to limit the scope of the present disclosure.

SUMMARY

The present disclosure envisages a non-conductive substrate with tracks formed thereon and a method for forming the tracks by sand blasting, and a method for forming the tracks on the non-conductive substrate. The method comprises the following steps:

providing the non-conductive substrate which is basically a low temperature co-fired ceramic (LTCC) material;

forming a layer of coating material of at least one of a conductive, a semi-conductive, and a non-conductive material on an operative face of the non-conductive substrate, the layer of coating material formed by screen printing a paste of at least one conductive, semi-conductive, and non-conductive material; the paste is dried thereafter;

disposing a stencil on the layer of coating material, thereby covering a selected portion of the layer of coating material while leaving exposed a portion of the layer of coating material corresponding to a pattern to be formed thus forming an assembly of the non-conductive substrate, the layer of coating material and the stencil;

eroding the exposed portion of the layer of coating material by propelling an abrasive material using a blasting gun towards the assembly on the face on which the layer of coating material is formed and the stencil is disposed; and separating the stencil from the abraded assembly;

wherein the abrasive material has a composition that has physical and chemical properties compatible with that of the non-conductive substrate.

Typically, the layer of coating material is selected from at least one group from the following:

A group of metals (or conductive materials) consisting of, but not limited to, silver, copper, gold, aluminum, iron and combinations thereof; a group of semi-conductive materials consisting of silicon, germanium binary ternary oxide semiconductors in the form of paste or photoresists a group of non-conductive material consisting of dielectric oxides including binary, ternary, quaternary combinations in the form of paste, tapes and/or photoresist Typically, the stencil is composed of a material that is resistant to the abrasive material such as steel, aluminum, copper, brass, FRP sheets and the like.

Typically, the abrasive material is a mixture of alumina and glass, wherein the glass is composed of $Bi_2O_3$, $V_2O_5$, $P_2O_5$ and $SiO_2$ such that the shrinkage and coefficient of thermal expansion of the mixture of alumina and glass is compatible with that of the non-conductive substrate (LTCC).

Further, the particle size of the abrasive material used to erode and/or remove the exposed layer of coating material is in the range from 10 μm to 50 μm.

Typically, the difference in the coefficient of thermal expansion of the abrasive material and the non-conductive substrate is substantially equal. More specifically, the difference in the thermal expansion coefficient of the abrasive material and the non-conductive substrate is equal to or less than $5 \times 10^{-6}/^\circ$ C.

Typically, the difference in the shrinkage of the abrasive material and the non-conductive substrate is substantially same and in particular, the difference in the shrinkage of the two is equal to or less than 0.5%.

Typically, the film formed on the non-conductive substrate has a thickness in the range from 10 μm to 30 μm.

In accordance with another embodiment of the present disclosure, a non-conductive substrate with tracks formed is disclosed using the method as described herein.

BRIEF DESCRIPTION OF ACCOMPANYING DRAWINGS

The non-conductive substrate with the tracks formed thereon and the method for forming one or more tracks on a non-conductive substrate will now be described with the help of the accompanying drawings in which.

DETAILED DESCRIPTION

The non-conductive substrate with the tracks formed thereon and the method for forming one or more tracks on a non-conductive substrate of the present disclosure will now be described with reference to the embodiments, which do not limit the scope and ambit of the disclosure. The description provided is purely by way of example and illustration. The embodiment herein, the various features, and advantageous details thereof are explained with reference to the non-limiting embodiments in the following description. Descriptions of well-known components and processing techniques are omitted so as to not unnecessarily obscure the embodiments herein. The examples used herein are intended merely to facilitate an understanding of ways in which the embodiments herein may be practiced and to further enable those of skill in the art to practice the embodiments herein. Accordingly, the examples should not be construed as limiting the scope of the embodiments herein.

Figure 1:
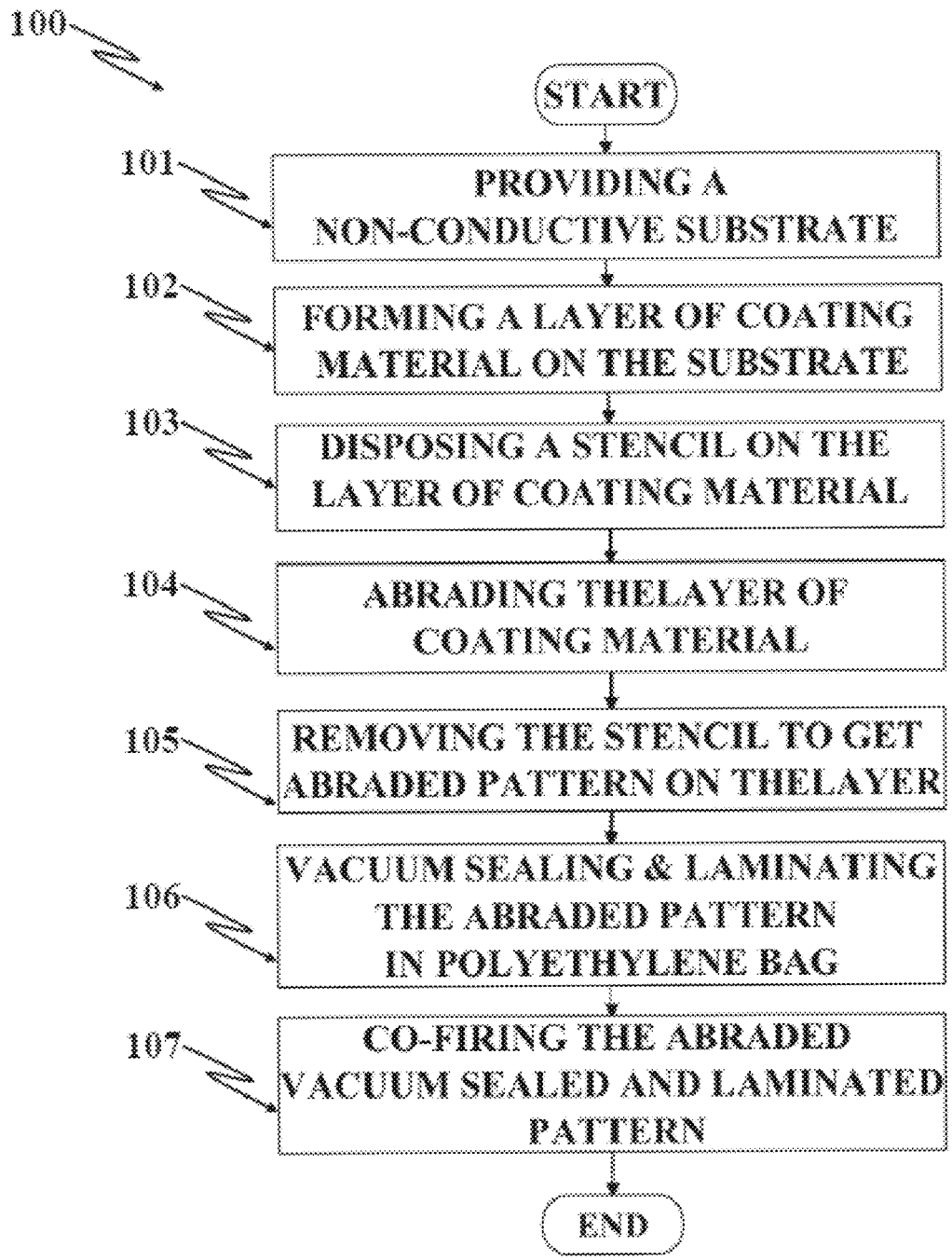
FIG. 1 illustrates a flow chart depicting the steps involved in the fabrication of the micron level tracks on the LTCC substrate using the method disclosed in accordance with an embodiment of the present disclosure.

The present disclosure provides a method for forming one or more tracks on a non-conductive substrate that obviates one or more drawbacks of the conventional method. Referring to FIG. 1 that illustrates a flow chart 100 depicting the steps involved in the fabrication of the micron level tracks on the LTCC substrate using the method disclosed in accordance with an embodiment of the present disclosure.

In accordance with an embodiment of the present disclosure, the method for forming track(s) on a non-conductive substrate comprises the following steps:

providing the non-conductive substrate (101);

forming a layer of coating material on an operative face of the non-conductive substrate (102);

disposing a stencil on the layer of coating material, thereby covering a selected portion of the layer of coating material while leaving exposed a portion of the layer of coating material corresponding to a pattern to be formed thus forming an assembly of the non-conductive substrate, the layer of coating material and the stencil (103);

eroding the exposed portion of the layer of coating material by propelling an abrasive material using a blasting gun towards the assembly on the face on which the layer of coating material is formed and the stencil is disposed (104); and separating the stencil from the abraded assembly to obtain desired tracks on the non-conducting substrate (105);

wherein the abrasive material has a composition that has physical and chemical properties that are compatible with that of the non-conductive substrate.

In accordance with another embodiment of the present disclosure, a non-conductive substrate with tracks formed thereon is disclosed, wherein the tracks are formed by sand blasting method. In particular, the present disclosure envisages a non-conductive substrate with tracks formed thereon wherein the tracks are formed by sand blasting method, wherein the method comprises the following steps:

providing the non-conductive substrate;

forming a layer of coating material on an operative face of the non-conductive substrate;

disposing a stencil on the layer of coating material, thereby covering a selected portion of the layer of coating material while leaving exposed a portion of the layer of coating material corresponding to a pattern to be formed thus forming an assembly of the non-conductive substrate, the layer of coating material and the stencil;

eroding the exposed portion of the layer of coating material by propelling an abrasive material using a blasting gun towards the assembly on the face on which the layer of coating material is formed and the stencil is disposed; and separating the stencil from the abraded assembly to obtain desired tracks on the non-conducting substrate;

wherein the abrasive material has a composition that has physical and chemical properties that are compatible with that of the non-conductive substrate.

In accordance with the present disclosure, after the step of forming the layer of coating material on the operative face of the non-conductive substrate, the layer of coating material is formed by applying the paste and is dried to remove the solvent therefrom.

In particular, in accordance with the present disclosure, at least the shrinkage and the coefficient of thermal expansion of the abrasive material that is used to abrade the layer of coating material formed on the non-conductive substrate are compatible with each other. Typically, the chemical composition of the abrasive material used to abrade the layer of coating material is compatible with that of the non-conductive substrate.

In accordance with the present disclosure, the physical and chemical properties of the non-conductive substrate, the layer of coating material formed thereon, and the abrasive material, used to abrade the layer of coating material, are compatible with each other.

It is observed that the composition of the sand or the abrasive material used to abrade the layer of coating material has a very significant impact on the properties of the non-conductive substrates including the shrinkage and the coefficient of thermal expansion.

More specifically, the abrasive material that is propelled on the material to erode it, does remove the material, but at the same time gets embedded in the non-conductive substrate. This changes the physical and chemical properties of the non-conductive substrate substantially, which is not desired.

In particular, for non-conducting substrates like that of LTCC the change in the physical and chemical properties due to embedding of the abrasive particles may generate strain or stress in the LTCC tape that may fracture or break the LTCC tape or can deform shape the LTCC tape during the step of co-firing. This is attributed to changes in the coefficient of the thermal expansion and shrinkage of the LTCC tape due to infusion or embedding to the abrasive particles during the step of abrading the layer of coating material formed on the non-conducting substrate (LTCC in this case).

The inventors of the present invention envisaged that if the physical and chemical properties of the abrasive material or particles and that of the non-conducting substrate (LTCC) are compatible with each other, that is, if the physical and chemical properties of the abrasive material are chosen such that even on embedding of the abrasive material in the LTCC substrate the physical and chemical properties of the LTCC substrate are not changed substantially, the problem of strain or stress generation in the LTCC tape that may fracture or break the LTCC tape or that of deformation in shape of the LTCC tape during the step of co-firing may be averted.

More specifically, if the shrinkage and the coefficient of the thermal expansion of the LTCC tape and that of the abrasive material grains or particles used to abrade the layer of coating material are similar, then the problem of strain or stress generation in the LTCC tape that may fracture or break the LTCC tape or that of deformation in shape of the LTCC tape during the step of co-firing can be averted.

In accordance with an embodiment of the present disclosure, the method for forming one or more tracks on a LTCC substrate comprises the following steps:
  providing the LTCC green tape substrate;
  forming a layer of coating material on an operative face of the LTCC green tape substrate;
  disposing a stencil on the layer of coating material thereby covering a selected portion of the layer of coating material while leaving exposed a portion of the layer of coating material corresponding to one or more tracks to be formed thus forming an assembly of the LTCC green tape substrate, the layer of coating material and the stencil;
  eroding the exposed portion of the layer of coating material by propelling an abrasive material using a blasting gun towards the assembly on the face on which the layer of coating material is formed and the stencil is disposed; and
  separating the stencil from the abraded assembly to obtain desired tracks on the LTCC green tape substrate;
  wherein the abrasive material has a composition that has physical and chemical properties that are compatible with that of the LTCC green tape substrate.

In accordance with the present disclosure, after the step of forming the layer of coating material on the operative face of the LTCC green tape substrate, the layer of coating material is formed by applying a paste of the material chosen from a group consisting of conductive material, semi-conductive material, non-conductive material and any combinations thereof. The paste is then dried to remove the solvent therefrom.

In accordance with the present disclosure, the layer of coating material is formed by screen printing process.

In accordance with the present disclosure, the layer of coating material is selected from a group of metals (or conductive materials) consisting of silver, copper, gold, aluminum, iron and combinations thereof.

In accordance with the present disclosure, the layer of coating material is selected from a group of semi-conductive materials consisting of silicon, germanium binary ternary oxide semiconductors in the form of paste or photoresists.

In accordance with the present disclosure, the layer of coating material is selected from a group of non-conductive materials consisting of glass dielectric oxides including binary, ternary, quaternary combinations in the form of paste, tapes and/or photoresist.

In accordance with the present disclosure, the stencil is composed of a material that is resistant to the abrasive material such as steel, aluminum, copper, brass and FRP sheets.

In accordance with an embodiment of the present disclosure, it is observed that a proper contact between the non-conductive substrate with the layer of coating material applied thereon, and the stencil that is placed on the layer of coating material is essential. It is necessary that during the whole process of sandblasting the stencil remain in contact with and in place on the layer of coating material. In the event of failing to provide proper contact between the two, it is observed that improper track formation takes place.

In order to achieve a proper contact without any gaps in between the layer of coating material and the stencil during the whole process of the sandblasting, the non-conductive substrate or the LTCC tape is pushed towards the stencil by applying fluid pressure at a surface that is opposite to the operative face. The fluid may be a gas such as pressurized air or nitrogen.

Further, the distance between the sandblasting gun that emits the abrasive particles or material is placed at a suitable distance such as to achieve optimum particle speed that would be sufficient to abrade the layer of coating material while keeping non-conductive substrate intact.

Still further, the desired speed of the abrasive particles may be achieved by controlling one of the:
  distance between the sandblasting gun and the assembly of the stencil and non-conductive substrate with the layer of coating material; and
  the pressure of the fluid that facilitates in providing required speed to the abrasive particles.

In accordance with the present disclosure, after abrading the layer of coating material with the abrasive material using the sandblasting process the abraded non-conductive substrate with the tracks formed thereon is cleaned with a pressurized fluid such as air or nitrogen so as to remove the loose dust particles settled thereon after the process of sandblasting, before and after removal of the stencil.

In accordance with the present disclosure, the abraded and cleaned non-conductive substrate with the tracks formed thereon are then vacuum sealed in polyethylene bag (106), laminated, and cut into individual packages and are co-fired (107) to obtain the required final LTCC or non-conductive substrate with the tracks thereon.

The process of co-firing of the LTCC is well known in the art. For example, the DuPont™ Green Tape™ low temperature co-fired ceramic system Design and Layout Guidelines describes the conventional co-firing process of LTCC and is incorporated herein in its entirety.

In accordance with the present disclosure, the abrasive material is a mixture of alumina and glass, wherein the glass is composed of $Bi_2O_3$, $V_2O_5$, $P_2O_5$ and $SiO_2$ so that the shrinkage and coefficient of thermal expansion of the mixture of alumina and glass is compatible with that of the non-conductive substrate.

In accordance with the present disclosure, the proportion of alumina-glass and the glass composition of the abrasive material particles is chosen so that the difference in the thermal expansion coefficient of the abrasive material and the non-conductive substrate is less than or equal to $5 \times 10^{-6}/°C$.

In accordance with the present disclosure, the proportion of alumina and glass and the glass composition of the abrasive material particles is chosen so that the difference in the shrinkage of the abrasive material and the non-conductive substrate is less than or equal to 0.5%.

In accordance with the present disclosure, the abrasive material has a particle size in the range from 10 μm to 50 μm. The particle size depends on the thickness of the tracks to be formed and/or eroded on the non-conductive substrate.

Typically, in accordance with the present disclosure, the layer of coating material has thickness in the range from 10 μm to 30 μm.

Typically, the thickness of the LTCC tape is in the range from 100 μm to 250 μm.

Figure 2A:
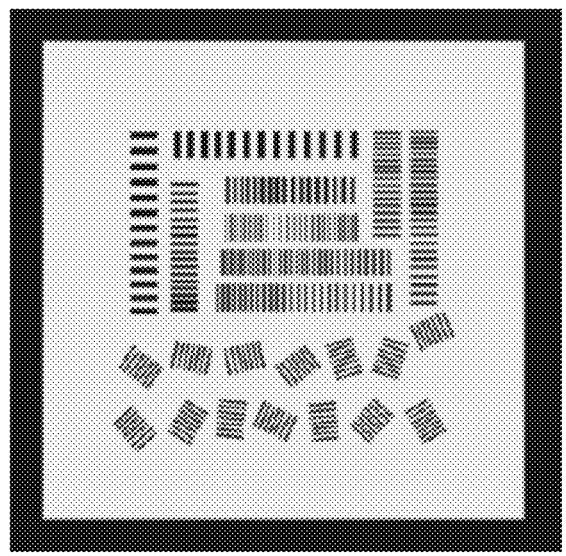
FIG. 2A illustrates a photograph of a stencil used for sandblasting in accordance with an embodiment of the present disclosure.
Figure 2B:
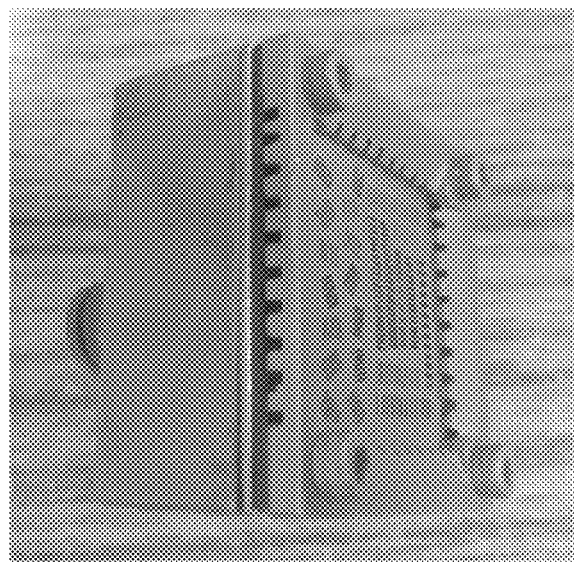
FIG. 2B illustrates a photograph of a jig used for sandblasting in accordance with an embodiment of the present disclosure.

Further, FIG. 2A illustrates a photograph of a stencil, whereas FIG. 2B illustrates a photograph of a jig used for sandblasting, in accordance with an embodiment of the present disclosure, wherein the jig or stencil and the patterns are formed thereon that are complimentary to the tracks to be formed on non-conductive substrate with the paste of at least one of the conductive, semi-conductive and non-conductive material applied thereon in the form of layer of coating material. Precision laser cutting or any other method that is capable of providing sub-micron cutting accuracy forms the stencil or jig. In an exemplary embodiment of the present disclosure, the jig and the stencil are made of steel.

Figure 3A:
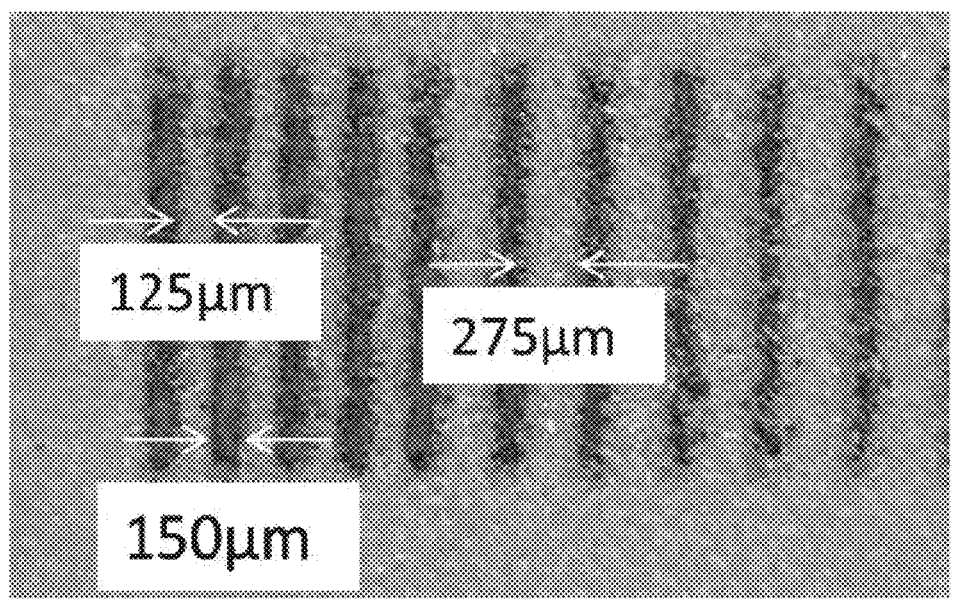
FIG. 3A illustrates a photograph of conductive tracks obtained on the LTCC substrate by conventional screen printing method.

FIG. 3A is a photograph of conductive tracks obtained on the LTCC substrate by conventional screen printing method, wherein the conductive tracks of the conductive layer of coating material that are formed on the non-conductive substrate are blurred. This indicates that the screen printing method is not suitable for obtaining micron level precision.

Figure 3B:
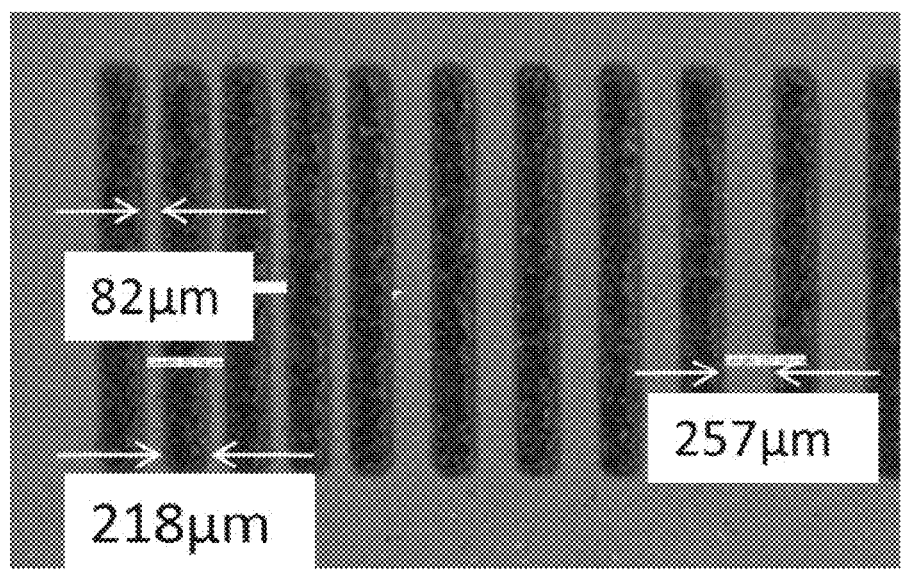
FIG. 3B illustrates a photograph of conductive tracks obtained on the LTCC substrate by the method of sandblasting or abrasive eroding as disclosed in accordance with the present disclosure.

FIG. 3B is photograph of conductive tracks obtained on the LTCC substrate by the method of sandblasting or abrasive eroding as disclosed in accordance with the present disclosure, wherein the conductive tracks of the conductive layer of coating material that are formed on the non-conductive substrate are clear and sharp in contrast to that obtained using the conventional screen printing technique. Thus, the presently disclosed method facilitates the formation of the conductive tracks that are sharp, distinct and clear.

Figure 4A:
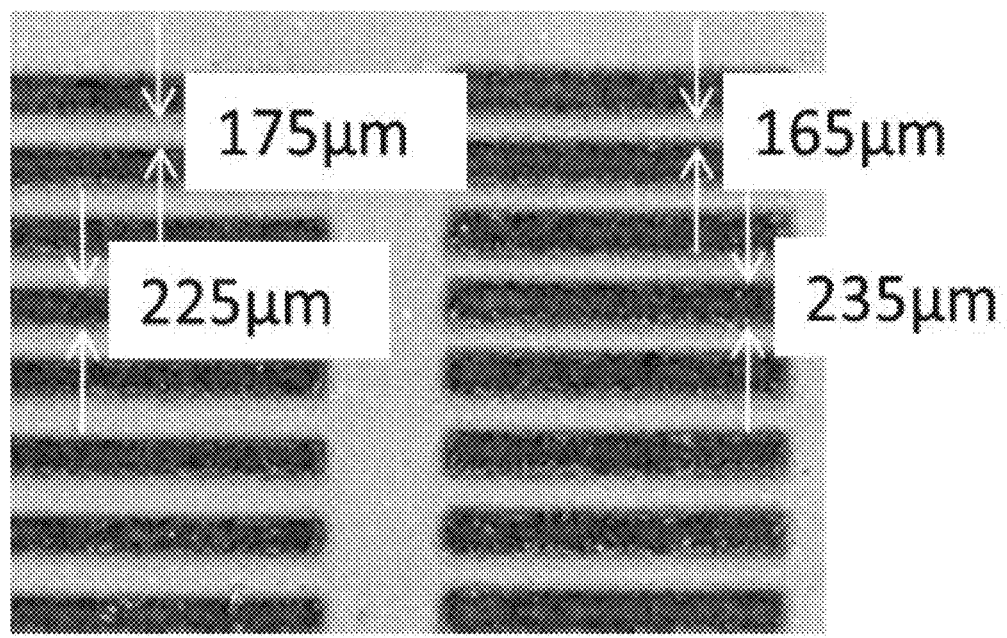
FIG. 4A illustrates a photograph of conductive tracks obtained on the LTCC substrate by the conventional screen printing method.

FIG. 4A is a photograph of conductive tracks obtained on the LTCC substrate by the conventional screen printing method, wherein it is observed that the thickness of the conductive tracks that can be achieved using the conventional screen printing technique is 100 microns or above.

Figure 4B:
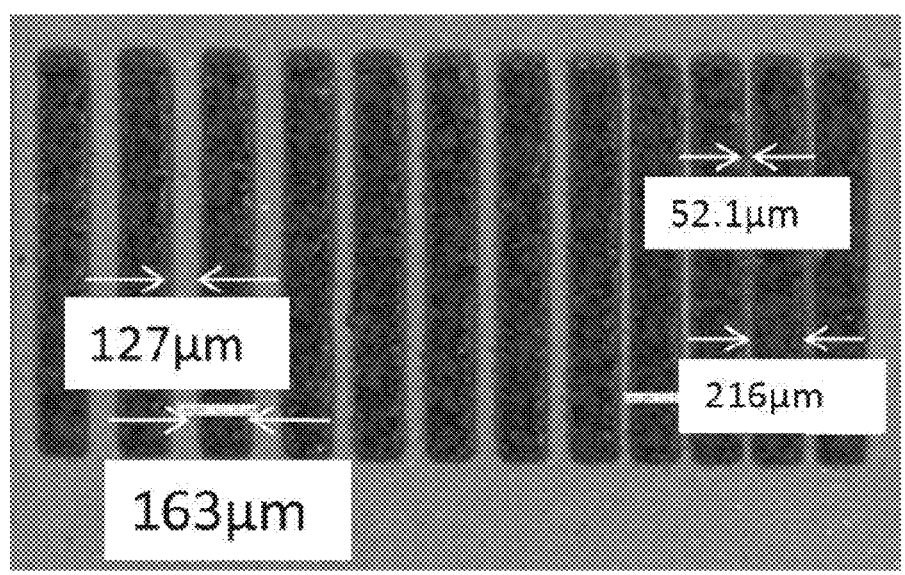
FIG. 4B illustrates a photograph of conductive tracks obtained on the LTCC substrate by the method of sandblasting or abrasive eroding as disclosed in accordance with the present disclosure, wherein a conductive track with 52 microns is achieved.

FIG. 4B is a photograph of conductive tracks obtained on the LTCC substrate by the method of sandblasting or abrasive eroding as disclosed in accordance with the present disclosure, wherein the conductive track with 52 micron is achieved.

Though the FIGS. 3A, 3B, 4A and 4B) relate to photographic images of the 'conductive tracks' formed on the LTCC substrate by the sandblasting method as disclosed in accordance with the embodiments of the present disclosure, it is to be noted that similar tracks can be formed by using the method of sand blasting as disclosed in accordance with the embodiments of the present disclosure by applying a layer of coating material or coating of semi-conductive or non-conductive material or any possible combination of the conductive, semi-conductive and non-conductive material on the non-conductive substrate or LTCC substrate.

Technical Advancements and Economic Significance

The method for forming tracks on a non-conductive substratein accordance with the present disclosure described herein above has several technical advantages including but not limited to the realization of conductive tracks on a non-conducting substrate, the method:
  facilitates formation of tracks on non-conductive substrate which may be LTCC substrate;
    provides improved dimensional accuracy of the tracks formed on the substrate;
    is not affected by ambient environmental conditions;
    is independent of human operator skills;
    is not limited by the paste properties applied on it.

Throughout this specification the word "comprise", or variations such as "comprises" or "comprising", will be understood to imply the inclusion of a stated element, integer or step, or group of elements, integers or steps, but not the exclusion of any other element, integer or step, or group of elements, integers or steps.

The use of the expression "at least" or "at least one" suggests the use of one or more elements or mixture or quantities, as the use may be in the embodiment of the disclosure to achieve one or more of the desired objects or results.

Any discussion of documents, acts, materials, devices, articles or the like that has been included in this specification is solely for the purpose of providing a context for the disclosure. It is not to be taken as an admission that any or all of these matters form part of the prior art base or were common general knowledge in the field relevant to the disclosure, as it existed anywhere before the priority date of this application.

Wherever a range of values is specified, a value up to 10% below and above the lowest and highest numerical value respectively, of the specified range, is included in the scope of the disclosure.

The numerical values mentioned for the various physical parameters, dimensions or quantities are only approximations and it is envisaged that the values higher/lower than the numerical values assigned to the parameters, dimensions or quantities fall within the scope of the disclosure, unless there is a statement in the specification specific to the contrary.

The invention claimed is:

1. A method for forming track(s) on a non-conductive substrate, said method comprising the following steps:
  forming a layer of coating material on an operative face of said non-conductive substrate;
  disposing a stencil on said layer of coating material thereby covering a selected portion of said layer of coating material while leaving exposed a portion of said layer of coating material corresponding to a pattern to be formed thereby forming an assembly of said non-conductive substrate, said layer of coating material and said stencil;
  eroding said exposed portion of said layer of coating material by propelling an abrasive material using a blasting gun towards said assembly on said operative face; and
  separating said stencil from said abraded assembly;
wherein said abrasive material is a mixture of alumina and glass, wherein said glass comprises $Bi_2O_3$, $V_2O_5$, $P_2O_5$ and $SiO_2$ so that the shrinkage and coefficient of thermal expansion of said mixture of alumina and glass is compatible with that of said non-conductive substrate.

2. The method as claimed in claim 1, wherein said non-conductive substrate is low temperature co-fired ceramic (LTCC).

3. The method as claimed in claim 1, wherein said layer of coating material is selected from a group of conductive materials consisting of silver, copper, gold, aluminum, iron and combinations thereof.

4. The method as claimed in claim 1, wherein said layer of coating material is selected from a group of semi-conductive materials consisting of silicon, germanium and combinations thereof.

5. The method as claimed in claim 1, wherein said layer of coating material is selected from a group of non-conductive materials consisting of dielectric oxides including binary, ternary, quaternary combinations in the form of paste, tapes and/or photoresist, quartz, glass and combinations thereof.

6. The method as claimed in claim 1, wherein said stencil is composed of a material that is resistant to said abrasive material including steel, aluminum, copper, brass, non-conducting polymers, glass-reinforced epoxy laminate sheet, and glass epoxy fiberglass sheets.

7. The method as claimed in claim 1, wherein said non-conductive substrate and said abrasive material has at least one of the following properties:

the difference in the thermal expansion coefficient between said non-conductive substrate and said abrasive material is equal to or less than $5\times10^{-6}/°$ C.; and the difference in the shrinkage between said non-conductive substrate and said abrasive material is equal to or less than 0.5%.

8. The method as claimed in claim 1, wherein said abrasive material has a particle size in the range from 10 μm to 50 μm; and wherein said layer of coating material has a thickness in the range from 10 μm to 30 μm.

9. A non-conductive substrate with tracks formed thereon, wherein said tracks are formed by a method comprising the following steps:

providing the non-conductive substrate;

forming a layer of coating material on an operative face of said non-conductive substrate;

disposing a stencil on said layer of coating material thereby covering a selected portion of said layer of coating material while leaving exposed a portion of said layer of coating material corresponding to a pattern to be formed thereby forming an assembly of said non-conductive substrate, said layer of coating material and said stencil;

eroding said exposed portion of said layer of coating material by propelling an abrasive material using a blasting gun towards said assembly on said operative face; and separating said stencil from said abraded assembly;

wherein said abrasive material a mixture of alumina and glass, wherein said glass comprises $Bi_2O_3$, $V_2O_5$, $P_2O_5$ and $SiO_2$ so that the shrinkage and coefficient of thermal expansion of said mixture of alumina and glass is compatible with that of said non-conductive substrate.

10. A non-conductive substrate with tracks formed on a coated layer on an operative face of said surface, said tracks being formed by selective erosion of said coated material of said layer.

\* \* \* \* \*